United States Patent
Chen et al.

(10) Patent No.: US 9,870,956 B2
(45) Date of Patent: Jan. 16, 2018

(54) FINFETS WITH NITRIDE LINERS AND METHODS OF FORMING THE SAME

(71) Applicant: Taiwan Semiconductor Manufacturing Company, Ltd., Hsin-Chu (TW)

(72) Inventors: Neng-Kuo Chen, Hsin-Chu (TW); Gin-Chen Huang, New Taipei (TW); Ching-Hong Jiang, Hsin-Chu (TW); Sey-Ping Sun, Hsin-Chu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/213,524

(22) Filed: Jul. 19, 2016

(65) Prior Publication Data
US 2016/0329329 A1    Nov. 10, 2016

Related U.S. Application Data

(63) Continuation of application No. 13/924,352, filed on Jun. 21, 2013.

(51) Int. Cl.
| | |
|---|---|
| *H01L 21/8238* | (2006.01) |
| *H01L 27/088* | (2006.01) |
| *H01L 21/762* | (2006.01) |
| *H01L 29/10* | (2006.01) |
| *H01L 29/66* | (2006.01) |
| *H01L 29/78* | (2006.01) |
| *H01L 21/8234* | (2006.01) |

(52) U.S. Cl.
CPC ......... *H01L 21/823821* (2013.01); *H01L 21/76224* (2013.01); *H01L 21/823431* (2013.01); *H01L 27/0886* (2013.01); *H01L 29/1054* (2013.01); *H01L 29/66795* (2013.01); *H01L 29/7851* (2013.01)

(58) Field of Classification Search
CPC ........... H01L 21/823821; H01L 21/823431
See application file for complete search history.

(56) References Cited

U.S. PATENT DOCUMENTS

| | | | |
|---|---|---|---|
| 5,652,176 A | 7/1997 | Maniar et al. | |
| 5,763,315 A * | 6/1998 | Benedict | H01L 21/76232 257/E21.545 |
| 6,261,973 B1 * | 7/2001 | Misium | H01L 21/31116 257/E21.252 |
| 7,517,764 B2 | 4/2009 | Booth, Jr. et al. | |
| 2006/0043521 A1 | 3/2006 | Trivedi et al. | |
| 2008/0188057 A1 | 8/2008 | Youn et al. | |
| 2011/0073952 A1 | 3/2011 | Kwok et al. | |
| 2011/0193178 A1 | 8/2011 | Chang et al. | |
| 2014/0151766 A1 * | 6/2014 | Eneman | H01L 29/1054 257/288 |

* cited by examiner

*Primary Examiner* — Yu-Hsi D Sun
(74) *Attorney, Agent, or Firm* — Slater Matsil, LLP

(57) ABSTRACT

An integrated circuit structure includes a semiconductor substrate, which includes a semiconductor strip. A Shallow Trench Isolation (STI) region is on a side of the semiconductor strip. The STI region includes a first portion comprising an oxide and a second portion free from oxide. The second portion separates the first portion from the semiconductor substrate. A semiconductor fin is over and aligned to the semiconductor strip, wherein the semiconductor fin is higher than a top surface of the STI region.

19 Claims, 6 Drawing Sheets

FINFETS WITH NITRIDE LINERS AND METHODS OF FORMING THE SAME

PRIORITY CLAIM AND CROSS-REFERENCE

This application is a continuation of U.S. patent application Ser. No. 13/924,352 filed on Jun. 21, 2013, entitled "FinFETs with Nitride Liners and Methods of Forming the Same," which application is hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions and the formation of the FinFETs, various wet etch steps and clean steps are performed. These steps cause the recess of the top surfaces of STI regions. As a result of the wet etch steps and clean steps, the center portions of the top surfaces of the STI regions may be lower than edge portions of the top surfaces of the STI regions. The STI regions with such a surface profile are known as having a (concave shape) smiling profile.

In some FinFETs, there are semiconductor strips underlying the semiconductor fins. In the respective FinFETs, parasitic capacitors are formed between the gate electrodes of the FinFETs and the neighboring semiconductor strip, wherein the STI regions act as the insulators of the parasitic capacitors. The parasitic capacitance of the parasitic capacitors adversely affects the performance of the respective integrated circuit, and needs to be reduced.

In addition, some of the FinFETs use germanium-containing materials to form fins. Germanium may form germanium oxide with the neighboring oxides in the STI regions. The germanium oxide causes the increase in the leakage current of the resulting FinFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Shallow Trench Isolation (STI) regions, Fin Field-Effect Transistors (FinFETs), and methods of forming the same are provided. The intermediate stages in the formation of the STI regions and the FinFETs are illustrated in accordance with exemplary embodiments. The variations of the embodiment are discussed. Throughout the various views and illustrative embodiments, like reference numbers are used to designate like elements.

Figure 1:
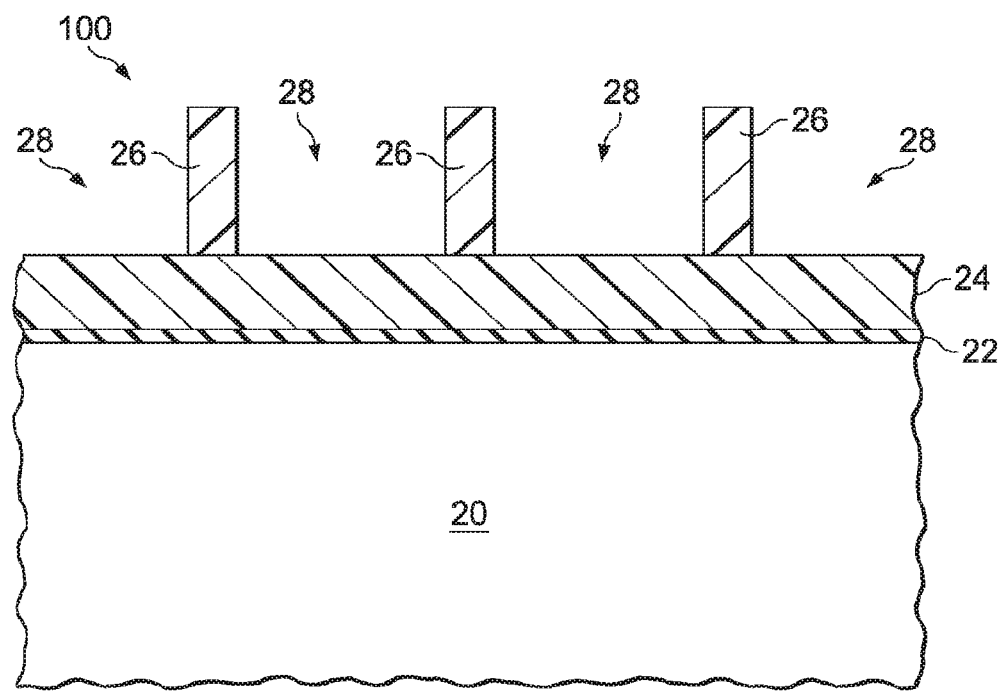
FIGS. 1 through 12 are cross-sectional views of intermediate stages in the manufacturing of Shallow Trench Isolation (STI) regions and Fin Field-Effect Transistors (FinFETs) in accordance with some exemplary embodiments.

Referring to FIG. 1, semiconductor substrate 20, which is a part of semiconductor wafer 100, is provided. In some embodiments, semiconductor substrate 20 includes crystalline silicon. Other commonly used materials, such as carbon, germanium, gallium, boron, arsenic, nitrogen, indium, and/or phosphorus, and the like, may also be included in semiconductor substrate 20. Semiconductor substrate 20 may be a bulk substrate or a Semiconductor-On-Insulator (SOI) substrate.

Pad layer 22 and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. In some embodiments, mask layer 24 is formed of silicon nitride, for example, using Low-Pressure Chemical Vapor Deposition (LPCVD). In other embodiments, mask layer 24 is formed by thermal nitridation of silicon, Plasma Enhanced Chemical Vapor Deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 2:
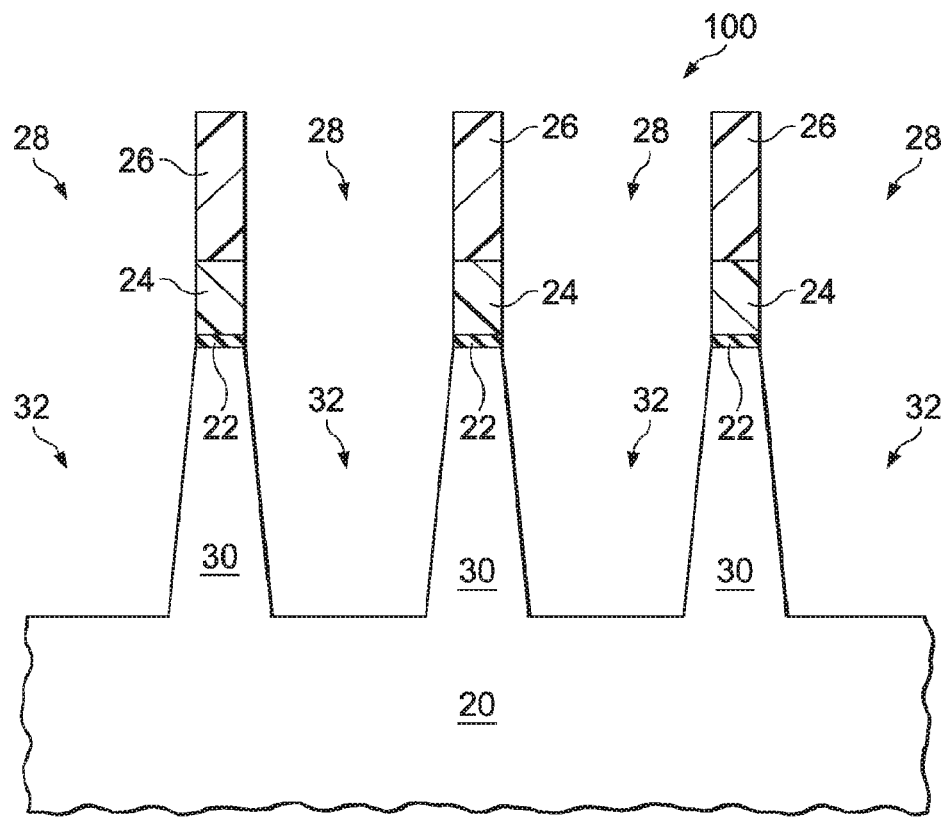

Referring to FIG. 2, mask layer 24 and pad layer 22 are etched through openings 28, exposing underlying semiconductor substrate 20. The exposed semiconductor substrate 20 is then etched, forming trenches 32. The portions of semiconductor substrate 20 between neighboring trenches 32 form semiconductor strips 30. Trenches 32 may be strips (when viewed in the top view of wafer 100) that are parallel to each other, and closely located from each other. After the etching of semiconductor substrate 20, photo resist 26 is removed. Next, a cleaning step may be performed to remove the native oxide formed on the surfaces of semiconductor substrate 20. The cleaning may be performed using diluted hydrofluoric (HF) acid, for example.

Figure 3:
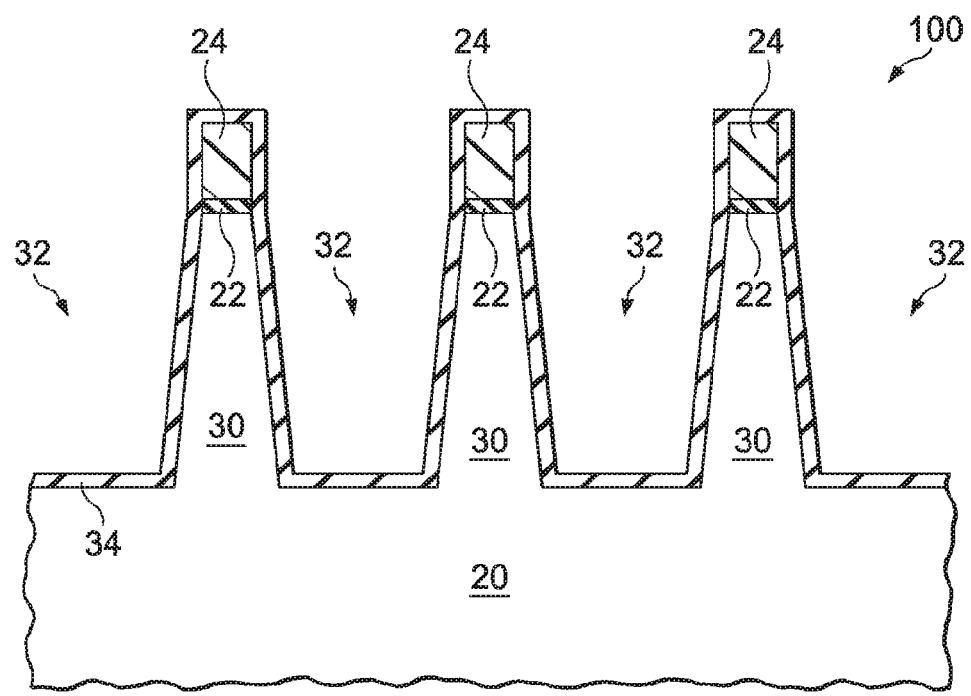

Next, as shown in FIG. 3, dielectric liner 34 is formed in trenches 32 and on the sidewalls of semiconductor strips 30, pad oxide 22, and hard mask 24. Dielectric liner 34 may be a conformal layer whose horizontal portions and vertical portions have thicknesses close to each other (for example, with difference smaller than about 20 percent). In some embodiments, dielectric liner 34 comprises a non-oxide containing material that is free from oxygen. In some exemplary embodiments, dielectric liner 34 comprises silicon nitride. In other embodiments, dielectric liner 34 comprises silicon carbon nitride, silicon oxynitride, or the like. Dielectric liner 34 may be formed using a deposition technique such as Sub Atmospheric Vapor Deposition (SACVD), Atomic Layer Deposition (ALD), or the like.

Figure 4:
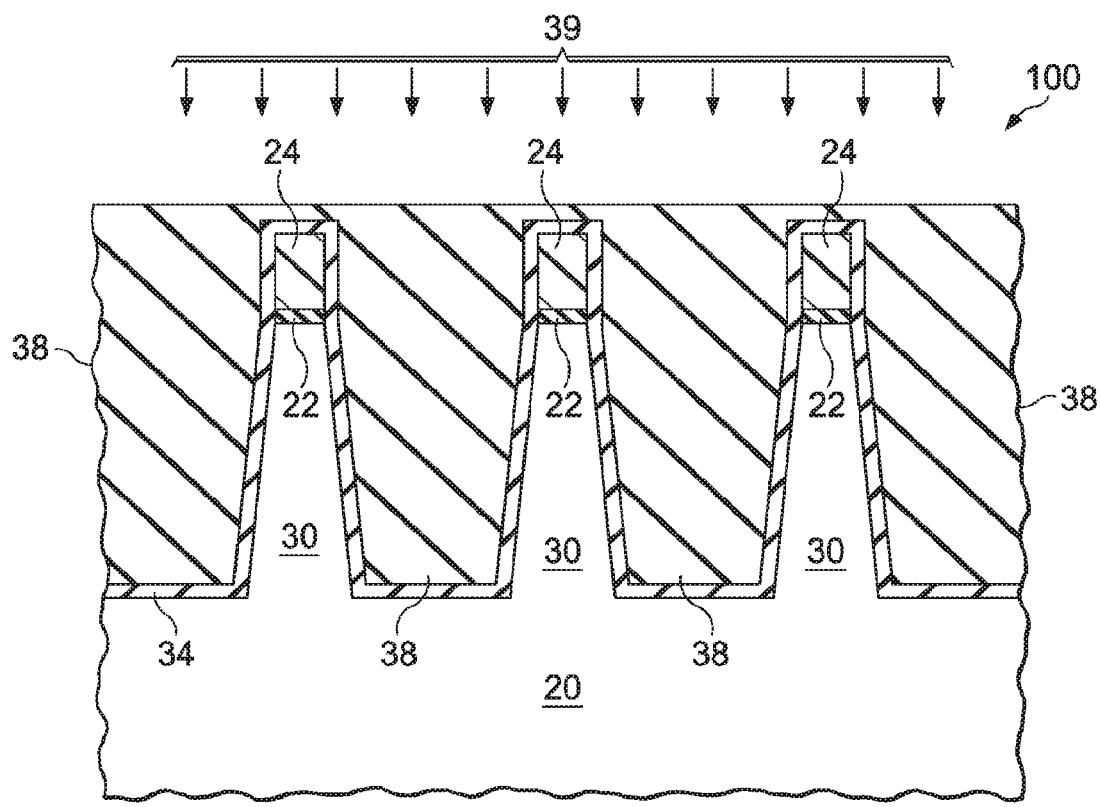

Next, the remaining portions of trenches 32 are filled with a dielectric material to form dielectric region 38, as shown in FIG. 4. The top surface of dielectric region 38 is higher than the top surface of mask layer 24. In some embodiments, the filling method may be selected from spin-on, Flowable Chemical Vapor Deposition (FCVD), and the like. Dielectric region 38 may include silicon oxide, and hence is referred to as oxide region 38 hereinafter. In alternative embodiments, oxide region 38 is formed using High Aspect-Ratio Process (HARP), High-Density Plasma CVD (HDPCVD), or the like. In the deposition of the respective dielectric region 38, the process gases may include tetraethylorthosilicate (TEOS) and O3 (ozone) (in the HARP process), or SiH4 and O2 (in the HDPCVD process).

Wafer 100 is then annealed, wherein the annealing is represented by arrows 39. In some embodiments, the annealing includes a wet anneal step, which is performed using In-Situ Steam Generation (ISSG), in which the steam of water is generated. The anneal step may be performed at temperatures between about 800° C. and about 1,050° C. The duration of the ISSG may be between about 1 minute and about 20 minutes. In alternative embodiments, the annealing is performed using a dry anneal method, wherein the process gas my include an O2, H2, N2, or the like, and the temperature may be between about 200° C., and about 700° C. The duration of the dry anneal may be between about 30 minutes and about 120 minutes. In yet alternative embodiments, the anneal step includes the wet anneal step followed by the dry anneal step.

Figure 5:
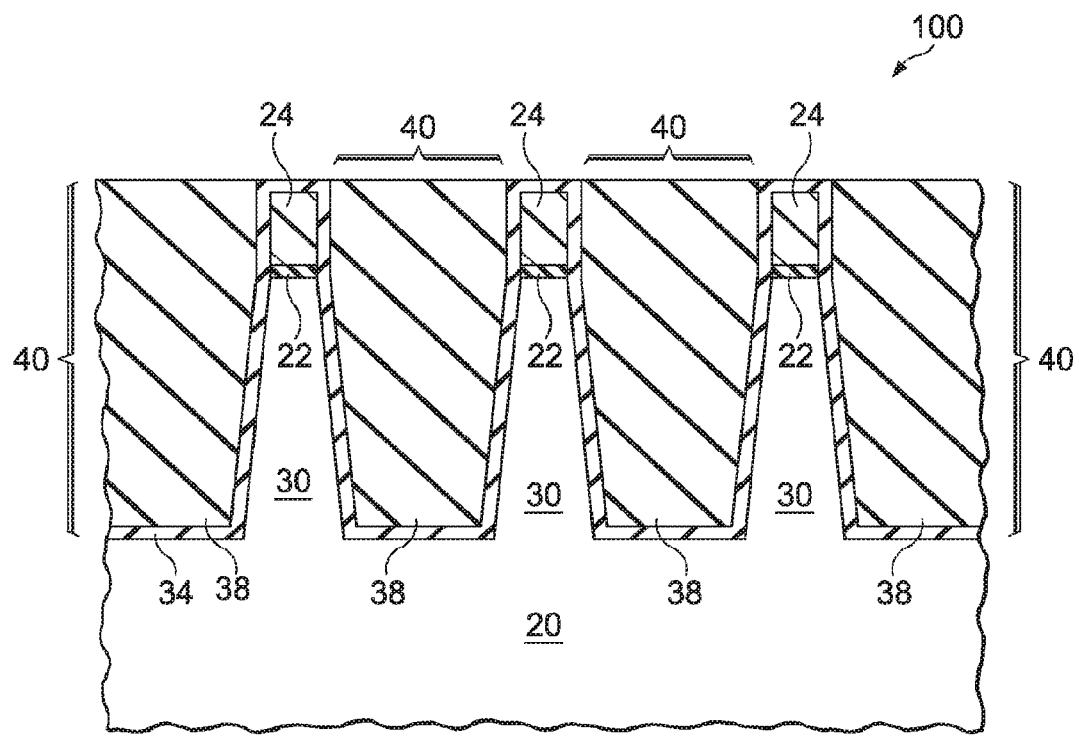

A planarization such as a Chemical Mechanical Polish (CMP) is then performed, as shown in FIG. 5, and hence STI regions 40 are formed, which include the remaining portions of dielectric liner 34 and dielectric region 38. Mask layer 24 or dielectric liner 34 may be used as the CMP stop layer, and hence the top surface of the remaining oxide region 38 is substantially level with the top surface of mask layer 24 or dielectric liner 34. Furthermore, the discrete portions of dielectric liner 34 are referred to as nitride liners 34 hereinafter, although they may be formed of other materials other than nitride.

Figure 6:
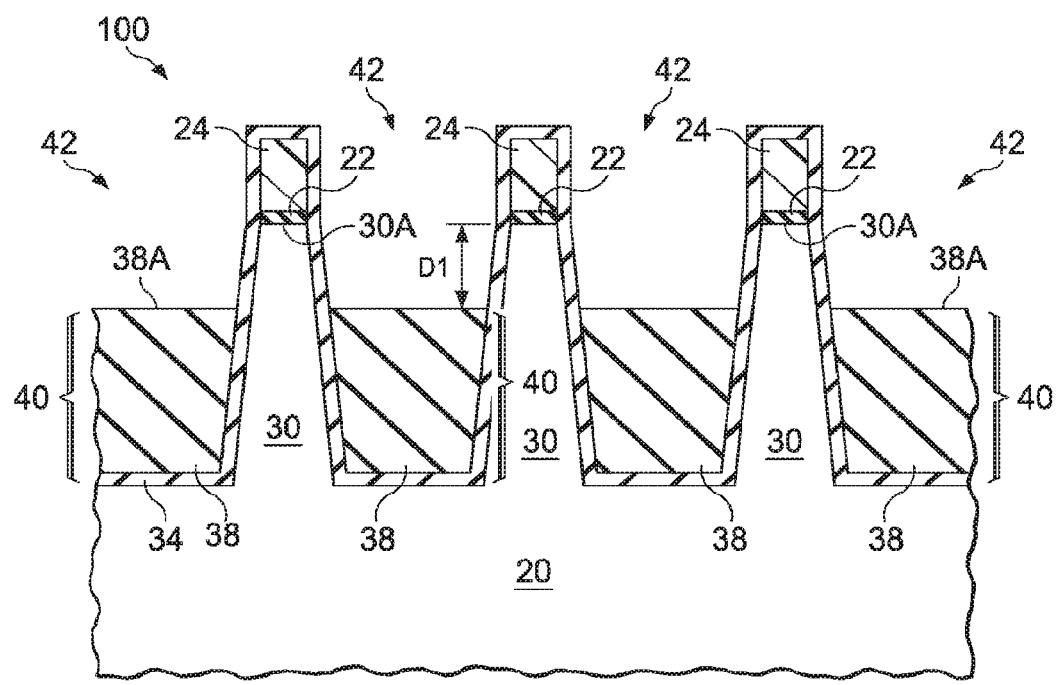

Referring to FIG. 6, oxide regions 38 in STI regions 40 are recessed to form recesses 42. The recessing may be performed in an isotropic etching step such as a wet etching step. The etchant is selected, so that the etching rate of oxide regions 38 is much higher than the etching rate of nitride liner 34 and mask layer 24 (if it is exposed). For example, the etchant may include a diluted hydrogen fluoride (HF) solution. After the recessing, the top surfaces 38A of oxide regions 38 are lower than the top surfaces 30A of semiconductor strips 30. Furthermore, top surfaces 38A may be recessed from top surfaces 30A by depth D1, which may be greater than about 100 Å, and may also be between about 20 Å and about 500 Å.

Figure 7:
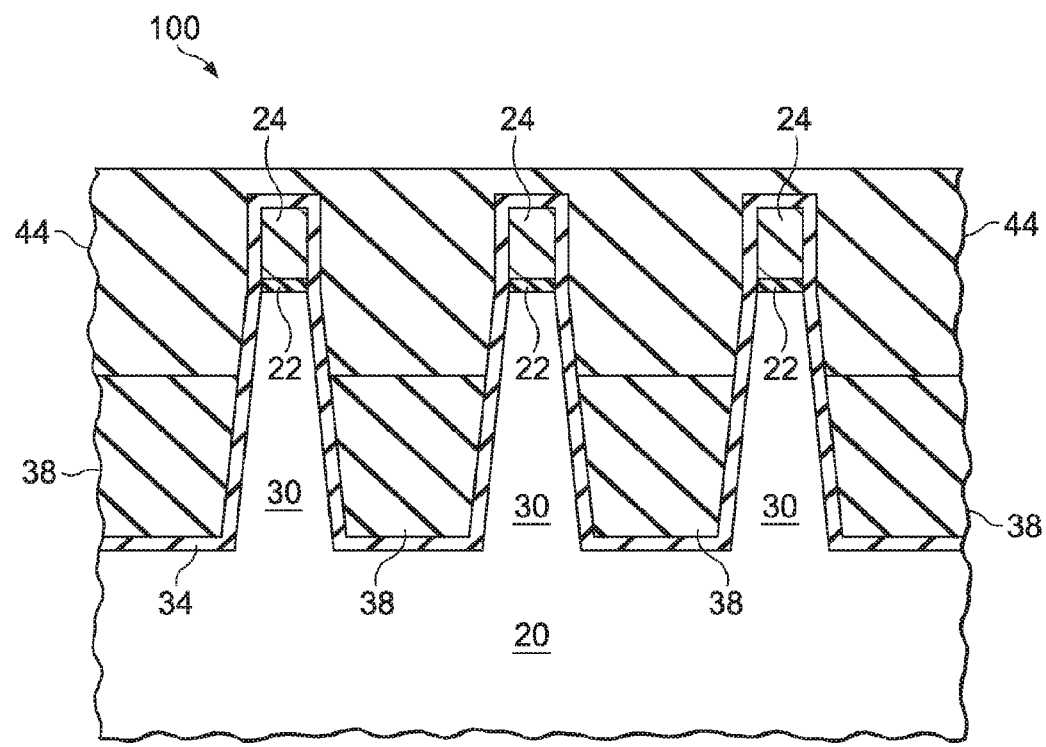

Next, as shown in FIG. 7, dielectric region 44 is formed in recesses 42 in FIG. 6. Dielectric region 44 contacts the sidewall portions of nitride liners 34. In some embodiments, dielectric region 44 is formed of a material that is selected from the same candidate materials of dielectric liners 34. Furthermore, dielectric region 44 and dielectric liners 34 may be formed of a same material, or may be formed of different materials. In some exemplary embodiments, dielectric region 44 comprises silicon nitride, and hence is referred to as nitride region 44 hereinafter, although it cannot be formed of other dielectric materials. Nitride region 44 may be formed using a deposition technique such as SACVD, ALD, or the like. The top surface of dielectric region 44 may be higher than the top surface of mask layer 24.

Figure 8:
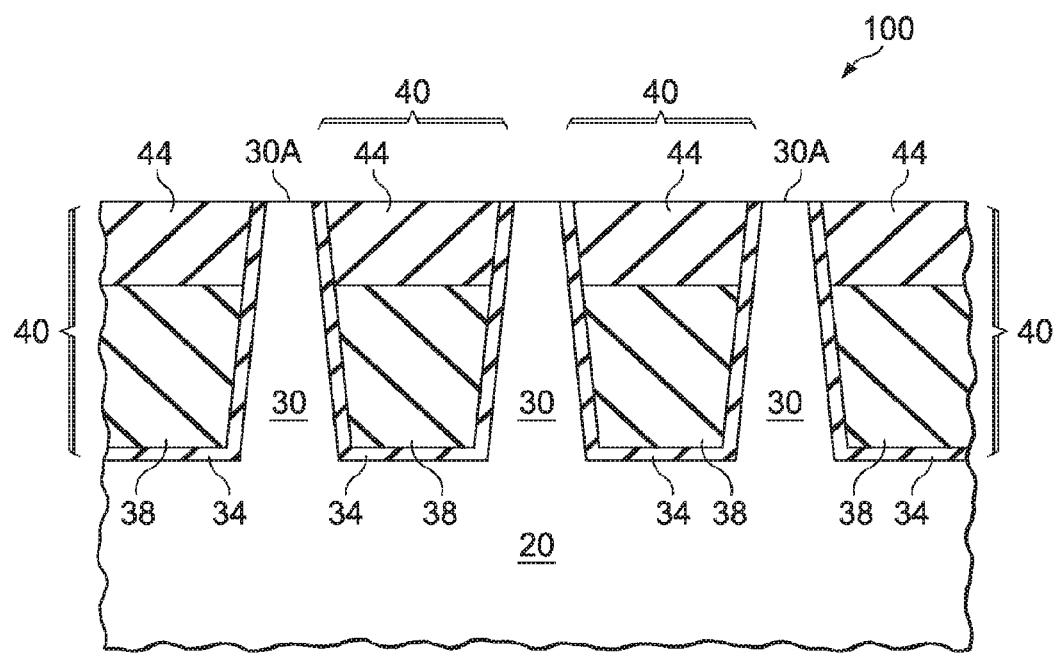

A CMP is then performed. In some embodiments, the CMP is stopped on the top surfaces 30A of semiconductor strips 30, as shown in FIG. 8. In which embodiments, pad oxide layer 22 (FIG. 7) is also removed. In alternative embodiments, the CMP may also be stopped on the top surface of pad oxide layers 22. In which embodiments, pad oxide layer 22 remains after the CMP, and an etching process is used to remove pad oxide layer 22. As shown in FIG. 8, nitride region 44 may be separated into a plurality of discrete regions that are spaced apart from each other by semiconductor strips 30. As a result of the formation and the CMP of nitride region 44, each of STI regions 40 includes a piece of nitride liner 34, one of oxide regions 38, and one of nitride regions 44.

Figure 9:
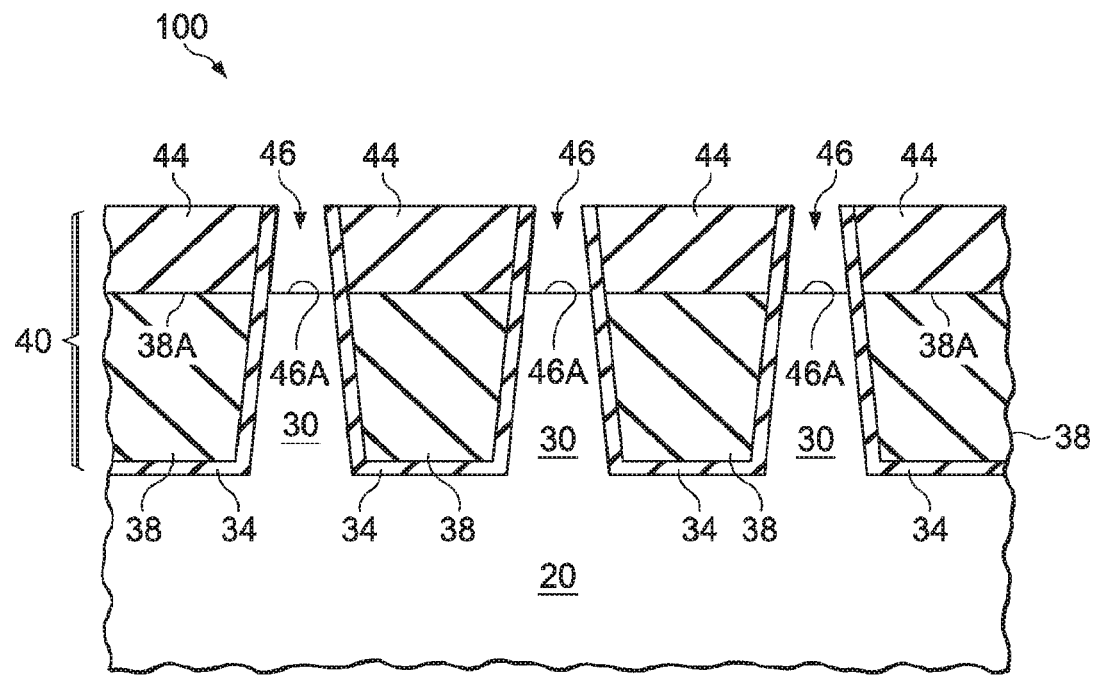

Next, as shown in FIG. 9, semiconductor strips 30, which are between opposite sidewalls of STI regions 40, are etched to form trenches 46. In some embodiments, bottoms 46A of trenches 46 are substantially level with top surface 38A of oxide regions 38. In alternative embodiments, bottoms 46A of trenches 46 are higher than or lower than top surfaces 38A of oxide regions 38. The etching may be performed using dry etching, with the etching gas selected from CF4, Cl2, NF3, SF6, and combinations thereof. In alternative embodiments, the etching may be performed using wet etching, for example, using Tetra-Methyl Ammonium Hydroxide (TMAH), a potassium hydroxide (KOH) solution, or the like, as the etchant. The etching rate for etching nitride liners 34 and nitride regions 44 is significantly lower than the etching rate of oxide regions 38, for example, with an etching selectivity greater than about 30 or 50. Hence, after the formation of trenches 46, nitride liners 34 and nitride regions 44 remain.

After the recessing, a pre-clean may be performed to remove any native oxide on the top surface of semiconductor strips 30. In some embodiments, diluted HF is used for the pre-clean. During the etching for forming trenches 46 and the pre-clean process, since the etching rate of nitride liners 34 is very low, the widths of trenches 46 remains unchanged. This is different from in conventional formation processes, in which the oxide in STI regions is etched significantly by the etchant for forming trenches and the pre-clean solution. Since the etchant for forming trenches 46 and the cleaning solutions typically have a high etching rate for etching oxide, in convention formation processes, the profile of the respective STI regions is undesirably changed, and the widths of the trenches are widened.

Figure 10:
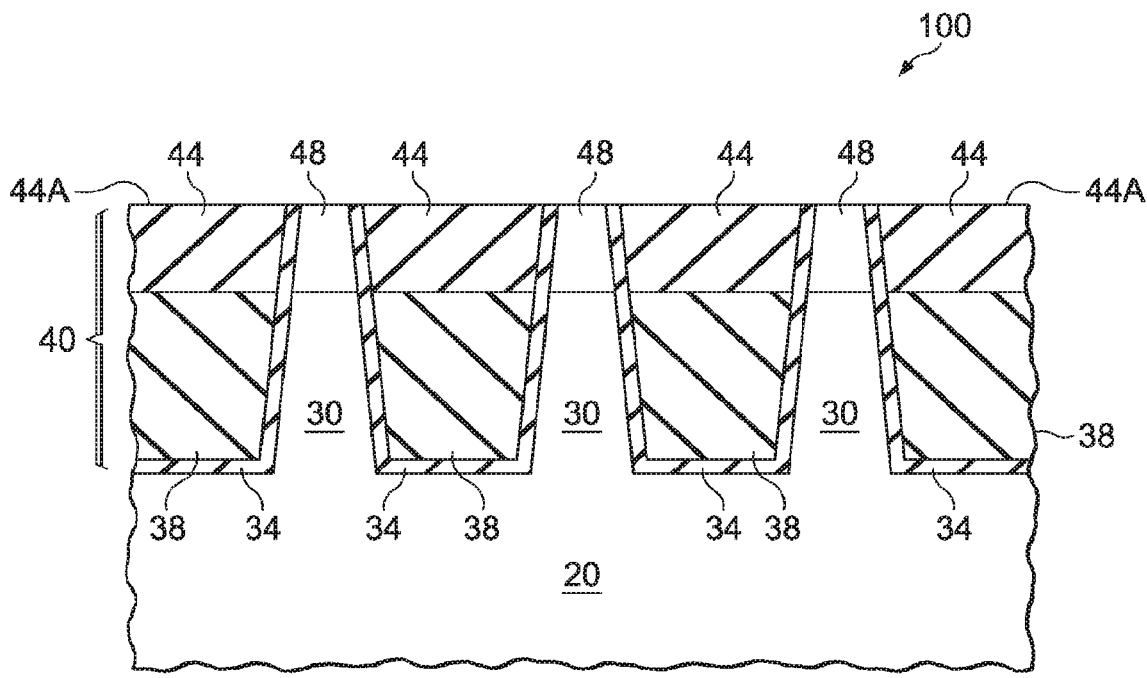

FIG. 10 illustrates the epitaxy of semiconductor regions 48, which are also referred to as semiconductor re-growth regions throughout the description. Semiconductor regions 48 are epitaxially grown from the exposed surfaces of semiconductor strips 30, which exposed surfaces are exposed to trenches 46 (FIG. 9). In some embodiments, semiconductor regions 48 comprise silicon germanium, with the atomic percentage of germanium greater than zero percent, and equal to or smaller than 100 percent. When the atomic percentage of germanium is 100 percent, semiconductor regions 48 are formed of pure germanium. In alternative embodiments, semiconductor regions 48 comprise a III-V compound semiconductor material selected from InAs, AlAs, GaAs, InP, GaN, InGaAs, InAlAs, GaSb, AlSb, AlP, GaP, and combinations thereof. Semiconductor regions 48 may be a homogenous region, with the bottom portions and top portions formed of a same material that has a same composition. Semiconductor regions 48 may also be a composite region, with bottom portions and top portions comprising different materials or having different compositions. For example, the upper portions of semiconductor regions 48 may have greater lattice mismatch with semiconductor strips 30 than lower portions. In some embodiments, semiconductor regions 48 comprise silicon germanium, with the upper portions having greater germanium percentages than lower portions.

The epitaxy is continued until the top surfaces of semiconductor regions 48 are higher than top surfaces 44A of nitride regions 44. A CMP is then performed until semiconductor regions 48 do not have portions left overlapping nitride regions 44. The portions of semiconductor regions 48 between STI regions 40, however, remain after the CMP.

Figure 11:
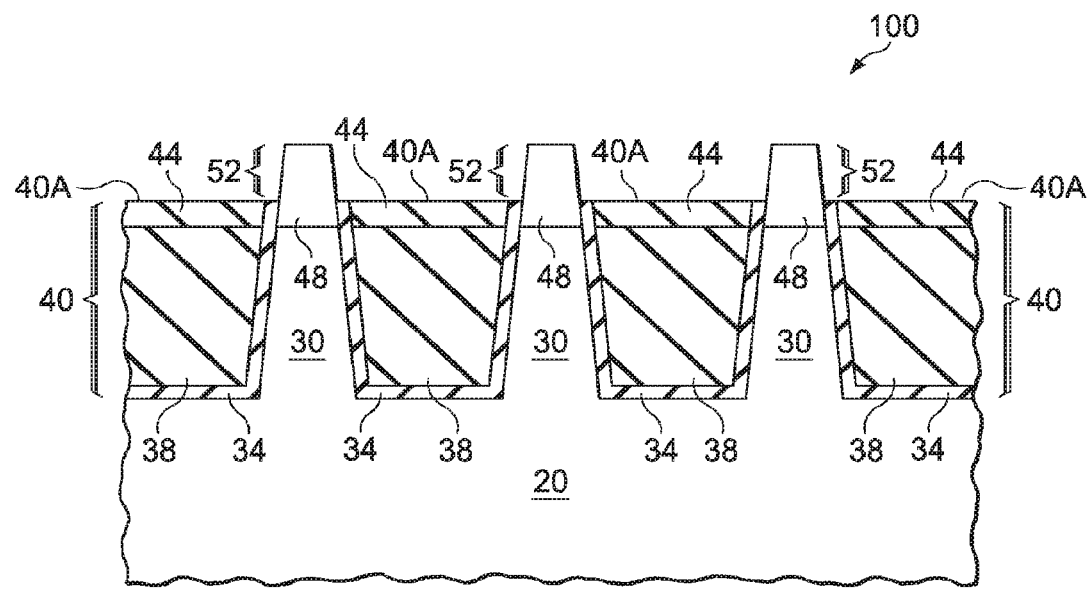

Next, as shown in FIG. 11, nitride regions 44 are recessed. In some embodiments, the recessing is stopped where nitride regions 44 still have some portions left, as shown in FIG. 11. Accordingly, the resulting STI regions 40 include nitride liner 34, oxide region 38, and nitride region 44, wherein nitride liner 34 and nitride region 44 in combination enclose oxide region 38 therein. As shown in FIG. 11, each of nitride liners 34 may form a basin, with one of oxide regions 38 disposed in each of the basin. A nitride region 44 further covers the basin. In some embodiments, nitride liners 34 and the respective overlying nitride region 44 may form a full enclosing shell, which fully encloses oxide region 38 therein, with no opening in the shell.

In alternative embodiments, after the recessing, nitride regions 44 are removed, and oxide regions 38 are exposed. As a result of the recessing, at least the top portions of semiconductor regions 48 are over the top surfaces 40A of STI regions 40, hence forming semiconductor fins 52. In some embodiments, semiconductor fins 52 include the top portions of semiconductor regions 48 and do not include semiconductor strips 30. In alternative embodiments, semiconductor fins 52 include semiconductor regions 48 and the top portions of semiconductor strips 30.

Figure 12:
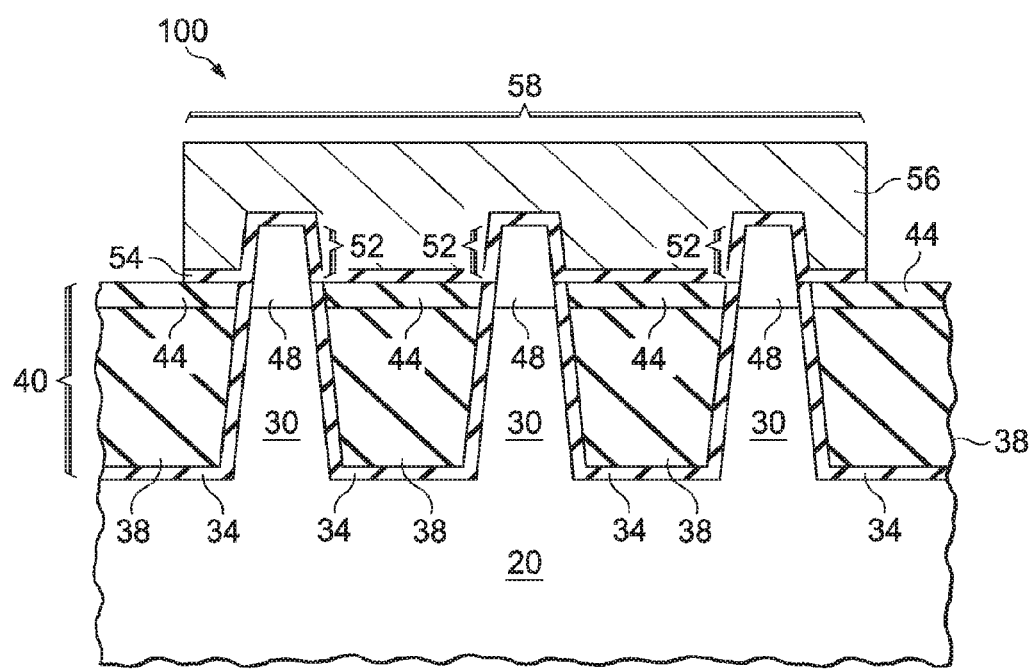

FIG. 12 illustrate the formation of FinFET 58, which includes forming gate dielectric 54 to cover the top surfaces and sidewalls of fins 52. Gate dielectric 54 may be formed through a thermal oxidation, and hence may include thermal silicon oxide. Alternatively, gate dielectric 54 may be formed through a deposition step, and may comprise high-k dielectric materials. Gate electrode 56 is then formed on gate dielectric 54. In some embodiments, gate electrode 56 covers more than one fin 52, so that the resulting FinFET 58 comprises more than one fin 52. In alternative embodiments, each of fins 52 may be used to form one FinFET. The remaining components of the FinFET 58, including source and drain regions and source and drain silicides (not shown, in a plane other than illustrated), are then formed. The formation processes of these components are known in the art, and hence are not repeated herein. Gate dielectric 54 and gate electrode 56 may be formed using a gate-first approach or a gate last approach. The details of the gate-first approach or the gate last approach are not described herein.

In accordance with the embodiments of the present disclosure, a dielectric liner, which may be a silicon nitride liner, is formed to separate the semiconductor strips from the neighboring STI regions. Accordingly, in the formation of the recesses (which are used for epitaxially re-growing semiconductor regions) and the cleaning steps, the widths of the recesses are not adversely increased. In addition, in the recessing of STI regions for forming semiconductor re-growth regions, the STI regions are protected by the dielectric regions such as silicon nitride regions. Accordingly, the profile of the STI regions is well maintained due to the low etching rate, and STI regions will not have smiling profiles. This results in the reduction in the adverse parasitic capacitance between the semiconductor strips and the gate electrode. In addition, by separating germanium-containing re-growth regions from oxides, the formation of germanium oxide is prevented. As a comparison, in conventional germanium-fin formation processes, germanium oxide is formed between germanium-containing re-growth regions and the neighboring STI regions, which causes the increase in leakage current.

In accordance with some embodiments, an integrated circuit structure includes a semiconductor substrate, which includes a semiconductor strip. A STI region is on a side of the semiconductor strip. The STI region includes a first portion comprising an oxide and a second portion free from oxide. The second portion separates the first portion from the semiconductor substrate. A semiconductor fin is over and aligned to the semiconductor strip, wherein the semiconductor fin is higher than a top surface of the STI region.

In accordance with other embodiments, an integrated circuit structure includes a semiconductor substrate comprising a semiconductor strip, and STI regions on opposite sides of the semiconductor strip. Each of the STI regions includes an oxide region, and a silicon nitride region over and in contact with the oxide region. A semiconductor fin is over and aligned to the semiconductor strip. The semiconductor fin is higher than a top surface of the silicon nitride region.

In accordance with yet other embodiments, a method includes etching a semiconductor substrate to form a recess, forming a nitride liner lining a bottom and a sidewall of the recess, forming an oxide region in the recess and over the nitride liner, and forming a nitride region to cover the oxide region. The nitride region, the nitride liner, and the oxide region in combination form a STI region. The method further includes removing a top portion of the nitride region and a top portion of the nitride liner. A semiconductor strip on a side and contacting the nitride liner forms a semiconductor fin, with the semiconductor fin higher than the STI region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   etching a semiconductor substrate to form a first recess;
   forming a nitride liner lining a bottom and a sidewall of the first recess; forming an oxide region in the first recess and over the nitride liner;
   forming a nitride region to cover the oxide region, wherein the nitride region, the nitride liner, and the oxide region in combination form a Shallow Trench Isolation (STI) region, wherein before forming the nitride region, the oxide region is recessed to form a recessed oxide region, and the nitride region is formed over the recessed oxide region; recessing a semiconductor fin to form a second recess between opposing portions of the nitride liner;

removing a top portion of the nitride region and a top portion of the nitride liner and performing an epitaxy to form a semiconductor re-growth region in the second recess, wherein the semiconductor re-growth region on a side and contacting the nitride liner is higher than the STI region.

2. The method of claim 1 further comprising:

forming a gate dielectric on a top surface and sidewalls of the semiconductor re-growth region, wherein the gate dielectric is in contact with a top surface of a remaining bottom portion of the nitride region; and forming a gate electrode over the gate dielectric, wherein the gate dielectric, the gate electrode, the semiconductor re-growth region, and the semiconductor fin comprise a Fin Field-Effect Transistor (FinFET).

3. The method of claim 1 further comprising:

forming a pad oxide layer and a hard mask layer over the semiconductor substrate;

patterning the pad oxide layer and the hard mask layer to form a patterned pad oxide layer and a patterned hard mask layer, respectively;

performing the step of etching the semiconductor substrate using the patterned hard mask layer as a mask; and performing the step of forming the nitride liner, wherein the nitride liner extends on sidewalls and a top surface of remaining portions of the hard mask layer.

4. The method of claim 1 further comprising before forming the nitride region, annealing the oxide region.

5. The method of claim 4, wherein the annealing comprises at least one of:

a temperature between about 800° C. and about 1050° C. for a duration of time between about 1 minute and about 20 minutes; or a temperature between about 200° C. and about 700° C. for a duration of time between about 30 minutes and about 120 minutes with a process gas comprising oxygen, hydrogen, or nitrogen.

6. The method of claim 1 further comprising, after forming the nitride region, performing a planarization to remove portions of the nitride region and the nitride liner over the semiconductor fin to expose the semiconductor fin.

7. The method of claim 6, wherein the semiconductor re-growth region comprises silicon germanium with an atomic percentage of germanium greater than 0% and less than or equal to 100%.

8. The method of claim 6, wherein the removing the top portion of the nitride region is performed after the epitaxy.

9. A method comprising:

etching a semiconductor substrate to form a first recess;

forming a first nitride region lining a bottom and a sidewall of the first recess; forming an oxide region in the first recess and over the first nitride region; forming a second nitride region to cover the oxide region, wherein the second nitride region, the first nitride region, and the oxide region in combination form a Shallow Trench Isolation (STI) region, wherein before forming the second nitride region, the oxide region is recessed to form a recessed oxide region, and the second nitride region is formed over the recessed oxide region;

recessing a semiconductor fin to form a second recess between opposing portions of the first nitride region;

removing a top portion of the second nitride region and a top portion of the first nitride region and performing an epitaxy to form a semiconductor re-growth region in the second recess, wherein the semiconductor re-growth region on a side and contacting the first nitride region has a top surface that is higher than a top surface of the STI region.

10. The method of claim 9 further comprising:

forming a gate dielectric on a top surface and sidewalls of the semiconductor re-growth region, wherein the gate dielectric is in contact with a top surface of a remaining bottom portion of the second nitride region; and forming a gate electrode over the gate dielectric, wherein the gate dielectric, the gate electrode, the semiconductor re-growth region, and the semiconductor fin are comprised in a Fin Field-Effect Transistor (FinFET).

11. The method of claim 9 further comprising:

forming a hard mask layer over the semiconductor substrate;

patterning the hard mask layer to form a patterned hard mask;

performing the step of etching the semiconductor substrate using the patterned hard mask as an etching mask; and performing the step of forming the first nitride region, wherein the first nitride region extends on sidewalls and a top surface of remaining portions of the hard mask layer.

12. The method of claim 9 further comprising before forming the second nitride region, annealing the oxide region.

13. The method of claim 12, wherein the annealing comprises at least one of:

a temperature between about 800° C. and about 1050° C. for a duration of time between about 1 minute and about 20 minutes; or a temperature between about 200° C. and about 700° C. for a duration of time between about 30 minutes and about 120 minutes with a process gas comprising oxygen, hydrogen, or nitrogen.

14. The method of claim 9 further comprising, after forming the second nitride region, performing a planarization to remove portions of the second nitride region and the first nitride region over the semiconductor fin to expose the semiconductor fin.

15. The method of claim 14, wherein the removing the top portion of the second nitride region is performed after the epitaxy.

16. A method comprising:

forming a first recess in a semiconductor substrate;

lining a bottom surface and a sidewall surface of the first recess with a first nitride region;

depositing an oxide region in the first recess and over the first nitride region; forming a second nitride region over the oxide region, wherein the second nitride region, the first nitride region, and the oxide region in combination form a Shallow Trench Isolation (STI) region, wherein before forming the second nitride region, the oxide region is recessed to form a recessed oxide region, and the second nitride region is formed over the recessed oxide region;

recessing an upper-most portion of the semiconductor substrate to form a second recess between opposing portions of the first nitride region; and epitaxially forming a semiconductor fin in the second recess, wherein the semiconductor fin is higher than an upper-most surface of the STI region.

17. The method of claim 16 further comprising removing a top portion of the second nitride region and a top portion of the first nitride region.

18. The method of claim 16 further comprising:
forming a gate dielectric on a top surface and sidewalls of the semiconductor fin, wherein the gate dielectric is in contact with a top surface of a bottom portion of the second nitride region; and
forming a gate electrode over the gate dielectric, wherein the gate dielectric, the gate electrode, and the semiconductor fin comprise a Fin Field-Effect Transistor (FinFET).

19. The method of claim 16, wherein the semiconductor fin comprises silicon germanium with an atomic percentage of germanium greater than 0% and less than or equal to 100%.

* * * * *